US012719490B2

(12) United States Patent
Huang

(10) Patent No.: US 12,719,490 B2
(45) Date of Patent: Aug. 25, 2026

(54) MULTIPLYING DIGITAL-TO-ANALOG CONVERTER (MDAC) AND CAPACITOR SWITCHING AMPLIFIER CIRCUIT THEREOF

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 83 days.

(21) Appl. No.: 18/941,409

(22) Filed: Nov. 8, 2024

(65) Prior Publication Data

US 2025/0158630 A1 May 15, 2025

(30) Foreign Application Priority Data

Nov. 15, 2023 (TW) ................................ 112144141

(51) Int. Cl.
*H03M 1/16* (2006.01)
*H03F 3/00* (2006.01)

(52) U.S. Cl.
CPC ............ *H03M 1/164* (2013.01); *H03F 3/005* (2013.01)

(58) Field of Classification Search
CPC ............................... H03M 1/164; H03F 3/005
USPC ................................................. 341/155, 161
See application file for complete search history.

(56) References Cited

U.S. PATENT DOCUMENTS 7,924,206 B2 4/2011 Sano
8,390,372 B2 * 3/2013 Buter ................. H03F 3/45475 330/9
9,755,582 B2 9/2017 Lin
10,312,925 B1 * 6/2019 Chen .................... H03M 1/164
2007/0090984 A1 4/2007 Lu
2016/0329881 A1 11/2016 Matsuno (Continued)

FOREIGN PATENT DOCUMENTS

EP 1917719 B1 2/2012

OTHER PUBLICATIONS

OA letter of a counterpart TW application (appl. No. 112144141) mailed on Aug. 16, 2024.

(Continued)

*Primary Examiner* — Khai M Nguyen
(74) *Attorney, Agent, or Firm* — WPAT, PC

(57) ABSTRACT

A multiplying digital-to-analog converter (MDAC) has two input terminals and two output terminals and includes: an analog-to-digital converter (ADC), a selection circuit, first and second sampling and amplifying circuits, an operational amplifier, and an amplification and level shifting circuit. The ADC generates a selection signal according to first and second input signals. The selection circuit selects two reference voltages from a plurality of preset voltages according to the selection signal. The first sampling and amplifying circuit samples and amplifies the first input signal according to one of the two reference voltages. The second sampling and amplifying circuit samples and amplifies the second input signal according to the other reference voltage. The operational amplifier has first and second output nodes. The amplification and level shifting circuit amplifies the first and second input signals and level shifts voltages at the first and second output nodes.

20 Claims, 14 Drawing Sheets

(56) References Cited

U.S. PATENT DOCUMENTS

2024/0283456 A1 8/2024 Huang

OTHER PUBLICATIONS

Musah et al., "Correlated level shifting technique with cross-coupled gain-enhancement capacitors", Jun. 18, 2009 vol. 45, Electronics Letters.

Gregoire et al., "An Over-60 dB True Rail-to-Rail Performance Using Correlated Level Shifting and an Opamp With Only 30 dB Loop Gain", Dec. 12, 2008, IEEE Journal of Solid-State Circuits.

* cited by examiner

MULTIPLYING DIGITAL-TO-ANALOG CONVERTER (MDAC) AND CAPACITOR SWITCHING AMPLIFIER CIRCUIT THEREOF

BACKGROUND OF THE INVENTION

1. Field of the Invention

The present invention generally relates to a multiplying digital-to-analog converter (MDAC) of a pipeline analog-to-digital converter (pipeline ADC, also known as pipelined ADC) and a capacitor switching amplifier circuit of the MDAC.

2. Description of Related Art

Reference is made to FIG. 1A, which is a circuit diagram of a correlated level shifting (CLS) switched capacitor (SC) circuit. The circuit in FIG. 1A includes an operational amplifier 110, a capacitor C1, a capacitor C2, a capacitor C3, a capacitor C4, a switch SW1, a switch SW2, a switch SW3, a switch SW4, and a switch SW5. The CLS circuit 120 includes the capacitor C3, the switch SW4, and the switch SW5.

FIG. 1B shows three clocks, namely the clock CLK1, the clock CLKe, and the clock CLK2. The circuit in FIG. 1A operates according to these three clocks. To be more specific, when the sampling phase Φs ends, the switch SW1 changes from conducting to non-conducting, the switch SW2 switches from the input signal Vin to the reference voltage (e.g., ground), and the switch SW3 switches from the input signal Vin to the capacitor C3 and the capacitor C4. During the estimation phase Φe, the switch SW4 is switched to the reference voltage, and the switch SW5 is turned on. During the amplification phase Φh, the switch SW4 is switched to the operational amplifier 110, and the switch SW5 is turned off.

Continuing the previous paragraph, during the estimation phase Φe, the capacitor C3 and the capacitor C4 are charged to the output voltage Vo of the operational amplifier 110. During the amplification phase Φh, the voltage at the output terminal of the operational amplifier 110 is level shifted so that the alternating current (AC) signal is 0.

The use of the correlated level shifting (CLS) technique can effectively decrease the required gain of the operational amplifier 110, which in turn reduces the power consumption and area of the operational amplifier 110. However, the circuit in FIG. 1A requires three clocks, which causes implementation difficulties and makes it hard to improve the circuit speed. In addition, when the CLS technique is applied to the multiplying digital-to-analog converter (MDAC) of a pipeline analog-to-digital converter (pipeline ADC, also known as pipelined ADC), an additional clock CLK3 is required (as shown in FIG. 2, for controlling the sub-ADC), which also increases the implementation difficulty and decreases the circuit speed.

SUMMARY OF THE INVENTION

In view of the issues of the prior art, an object of the present invention is to provide a multiplying digital-to-analog converter (MDAC) and a capacitor switching amplifier circuit thereof, so as to make an improvement to the prior art.

According to one aspect of the present invention, an MDAC is provided. The MDAC has a first input terminal, a second input terminal, a first output terminal, and a second output terminal. The MDAC includes an analog-to-digital converter (ADC), a selection circuit, a first sampling and amplifying circuit, a second sampling and amplifying circuit, an operational amplifier, and an amplification and level shifting circuit. The ADC is coupled to the first input terminal and the second input terminal and configured to generate a selection signal according to a first input signal and a second input signal. The selection circuit is coupled to the ADC and configured to select a first reference voltage and a second reference voltage from a plurality of preset voltages according to the selection signal. The first sampling and amplifying circuit is coupled to the selection circuit and the first input terminal and configured to sample and amplify the first input signal according to the first reference voltage. The second sampling and amplifying circuit is coupled to the selection circuit and the second input terminal and configured to sample and amplify the second input signal according to the second reference voltage. The operational amplifier is coupled to the first sampling and amplifying circuit and the second sampling and amplifying circuit and has a first output node and a second output node. The amplification and level shifting circuit is coupled to the first output node, the second output node, the first output terminal, the second output terminal, the first input terminal, the second input terminal, and the selection circuit and configured to amplify the first input signal and the second input signal and to level shift a voltage at the first output node and a voltage at the second output node.

According to another aspect of the present invention, a capacitor switching amplifier circuit is provided. The capacitor switching amplifier circuit has a first input terminal, a second input terminal, a first output terminal, and a second output terminal. The capacitor switching amplifier circuit includes a first sampling and amplifying circuit, a second sampling and amplifying circuit, an operational amplifier, a first switched capacitor (SC) circuit, and a second SC circuit. The first sampling and amplifying circuit is coupled to the first input terminal and configured to sample and amplify a first input signal. The second sampling and amplifying circuit is coupled to the second input terminal and configured to sample and amplify a second input signal. The operational amplifier is coupled to the first sampling and amplifying circuit and the second sampling and amplifying circuit and has a first output node and a second output node. The first SC circuit is coupled to the first output node and the first output terminal and configured to amplify the first input signal and the second input signal and to level shift a voltage at the first output node. The second SC circuit is coupled to the second output node and the second output terminal and configured to amplify the first input signal and the second input signal and to level shift a voltage at the second output node.

The technical means embodied in the embodiments of the present invention can solve at least one of the problems of the prior art. Therefore, compared to the prior art, the present invention is easier to design and improves the circuit speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a multiplying digital-to-analog converter (MDAC) and a capacitor switching amplifier circuit thereof. On account of that some or all elements of the MDAC and the capacitor switching amplifier circuit thereof could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following description, signals are active-high, which means that signals are active at high levels and inactive at low levels, and that asserting/de-asserting a signal means setting the signal high/low. This is for the purpose of explanation, not for limiting the scope of the invention. In other words, in an alternative implementation, signals can be active-low, which means that signals are active at low levels and inactive at high levels, and that asserting/de-asserting a signal means setting the signal low/high. A level transition or a logic level transition means that a signal changes from an asserted (active) state to a de-asserted (inactive) state, or from a de-asserted (inactive) state to an asserted (active) state.

Figure 3:
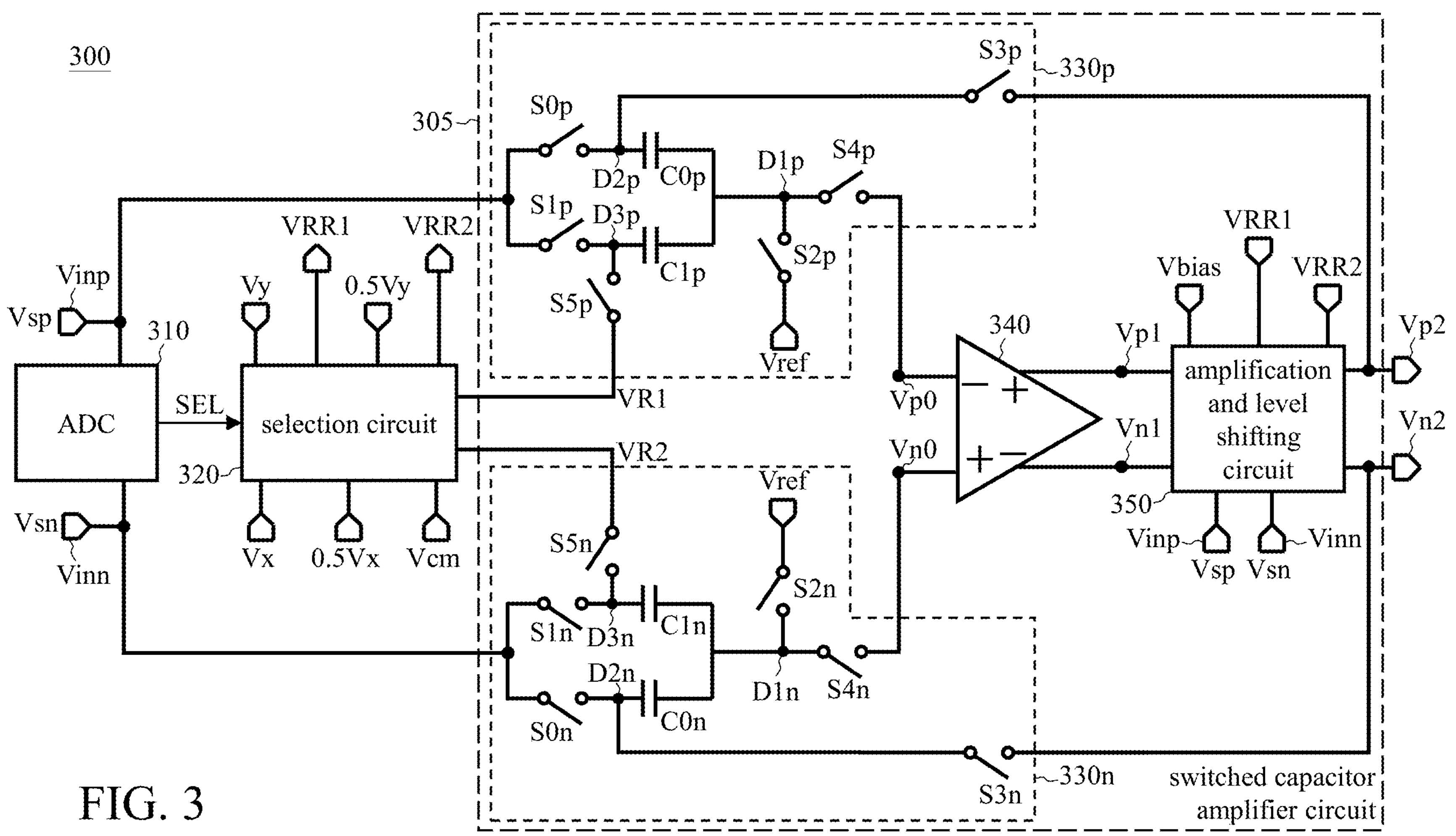
FIG. 3 is the functional block diagram of a multiplying digital-to-analog converter (MDAC) according to an embodiment of the present invention.

Reference is made to FIG. 3, which is a functional block diagram of an MDAC according to an embodiment of the present invention. The MDAC 300 is a 1.5-bit MDAC, which has an input terminal Vinp, an input terminal Vinn, an output terminal Vp2, and an output terminal Vn2. The MDAC 300 includes a capacitor switching amplifier circuit 305, an analog-to-digital converter (ADC) 310, and a selection circuit 320. The capacitor switching amplifier circuit 305 includes a sampling and amplifying circuit 330*p*, a sampling and amplifying circuit 330*n*, an operational amplifier 340, and an amplification and level shifting circuit 350.

When the MDAC 300 is applied to a pipeline analog-to-digital converter (pipeline ADC, also known as pipelined ADC), the ADC 310 is the sub-ADC of the pipeline ADC. The ADC 310 is coupled to the input terminal Vinp and the input terminal Vinn and configured to generate a selection signal SEL according to the input signal Vsp and input signal Vsn. The input signal Vsp (=Vdc+dV) and the input signal Vsn (=Vdc−dV) may be a differential signal pair, where Vdc is the common-mode voltage of the two, and dV is the signal component.

The selection circuit 320 is coupled to the ADC 310 and configured to determine, according to the selection signal SEL, a reference voltage VR1, a reference voltage VR2, a reference voltage VRR1, and a reference voltage VRR2 from multiple preset voltages (including, but not limited to, a preset voltage Vx, 0.5 times the preset voltage Vx, a preset voltage Vy, 0.5 times the preset voltage Vy, and the common-mode voltage Vcm of the preset voltage Vx and the preset voltage Vy), to provide the reference voltage VR1 and the reference voltage VR2 to the sampling and amplifying circuit 330*p* and the sampling and amplifying circuit 330*n*, respectively, and to provide the reference voltage VRR1 and the reference voltage VRR2 to the amplification and level shifting circuit 350. The preset voltage Vx may be Vcm+Vz, the preset voltage Vy may be Vcm−Vz, and Vz is a direct current (DC) voltage. In some embodiments, the selection circuit 320 may be a multiplexer.

Based on the operating principles of the pipeline ADC, people having ordinary skill in the art can understand that the roles of the ADC 310 and the selection circuit 320 are to prevent excessively high output voltages of the MDAC 300 (i.e., the voltage at the output terminal Vp2 and the voltage at the output terminal Vn2). Consequently, further elaboration on the internal circuits and operational details of the ADC 310 and the selection circuit 320 is omitted here for brevity.

The sampling and amplifying circuit 330*p* and the sampling and amplifying circuit 330*n* have corresponding components and each include two capacitors and six switches. The details are discussed below.

The two terminals of the capacitor C0*p* (capacitor C0*n*) are the node D1*p* (node D1*n*) and the node D2*p* (node D2*n*), respectively. The two terminals of the capacitor C1*p* (capacitor C1*n*) are the node D1*p* (node D1*n*) and the node D3*p* (node D3*n*), respectively.

One terminal of the switch S0*p* (switch S0*n*) is coupled or electrically connected to the input terminal Vinp (input terminal Vinn); the other terminal of the switch S0*p* (switch S0*n*) is coupled or electrically connected to the node D2*p* (node D2*n*).

One terminal of the switch S1*p* (switch S1*n*) is coupled or electrically connected to the input terminal Vinp (input terminal Vinn); the other terminal of the switch S1*p* (switch S1*n*) is coupled or electrically connected to the node D3*p* (node D3*n*).

One terminal of the switch S2*p* (switch S2*n*) is coupled or electrically connected to the node D1*p* (node D1*n*); the other terminal of the switch S2*p* (switch S2*n*) receives or is coupled to a reference voltage Vref (e.g., ground).

One terminal of the switch S3*p* (switch S3*n*) is coupled or electrically connected to the node D2*p* (node D2*n*); the other terminal of the switch S3*p* (switch S3*n*) is coupled or electrically connected to the output terminal Vp2 (output terminal Vn2).

One terminal of the switch S4*p* (switch S4*n*) is coupled or electrically connected to the node D1*p* (node D1*n*); the other terminal of the switch S4*p* (switch S4*n*) is coupled or electrically connected to an input terminal of the operational amplifier 340 (more specifically, the input node Vp0 (input node Vn0)).

One terminal of the switch S5*p* (switch S5*n*) is coupled or electrically connected to the node D3*p* (node D3*n*); the other terminal of the switch S5*p* (switch S5*n*) receives the reference voltage VR1 (reference voltage VR2) (i.e., coupled or electrically connected to the selection circuit 320).

The inverting input terminal (i.e., the input node Vp0) of the operational amplifier 340 is coupled or electrically connected to the sampling and amplifying circuit 330*p*; the non-inverting input terminal (i.e., the input node Vn0) of the operational amplifier 340 is coupled or electrically connected to the sampling and amplifying circuit 330*n*. The output node Vp1 is the non-inverting output terminal of the operational amplifier 340; the output node Vn1 is the inverting output terminal of the operational amplifier 340.

The amplification and level shifting circuit 350 is coupled or electrically connected to the output node Vp1, the output node Vn1, the output terminal Vp2, the output terminal Vn2, the input terminal Vinp (for receiving the input signal Vsp), the input terminal Vinn (for receiving the input signal Vsn), and the selection circuit 320 (for receiving the reference voltage VR1 and the reference voltage VR2). The amplification and level shifting circuit 350 amplifies the signal component (i.e., dV) of the input signal Vsp and the input signal Vsn and level shifts the voltage at the output node Vp1 and the voltage at the output node Vn1.

Figure 4:
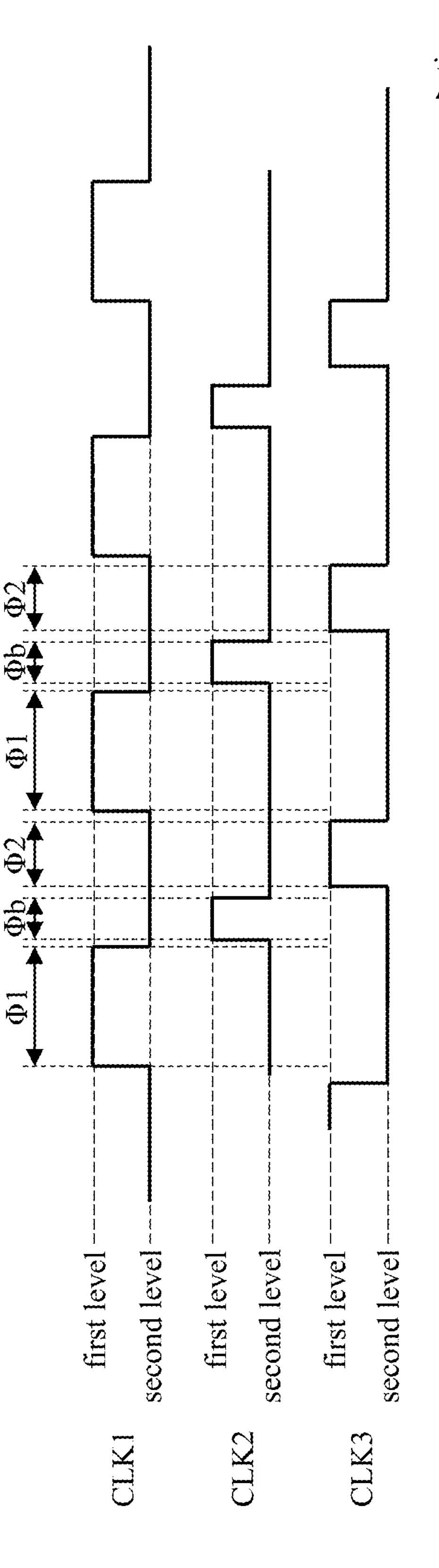
FIG. 4 shows the waveform of the clocks of the present invention.

Reference is made to FIG. 4, which shows waveform of the clocks of the present invention. The clock CLK1, the clock CLK2, and the clock CLK3 are not at the first level (e.g., high level) at the same time.

During the phase D1 (i.e., when the clock CLK1 is at the first level and the clocks CLK2 and CLK3 are at the second level (e.g., low level)), the sampling and amplifying circuit 330*p* and the sampling and amplifying circuit 330*n* sample the input signals Vsp and Vsn, and the amplification and level shifting circuit 350 amplifies the signal component dV of the input signals Vsp and Vsn (which will be discussed in detail below in connection with FIG. 5).

To be more specific, during the phase Φ1, the switch S0*p* (switch S0*n*), the switch S1*p* (switch S1*n*), and the switch S2*p* (switch S2*n*) are turned on, and the switch S3*p* (switch S3*n*), the switch S4*p* (switch S4*n*), and the switch S5*p* (switch S5*n*) are turned off, so that the capacitor C0*p* (capacitor C0*n*) and the capacitor C1*p* (capacitor C1*n*) sample the input signal Vsp (input signal Vsn).

During the phase Φb (i.e., when the clock CLK2 is at the first level, and the clocks CLK1 and CLK3 are at the second level), the ADC 310 generates the selection signal SEL, the selection circuit 320 generates the reference voltage VR1 and the reference voltage VR2 according to the selection signal SEL, and the amplification and level shifting circuit 350 samples the reference voltage VR1 and the reference voltage VR2.

Figure 5:
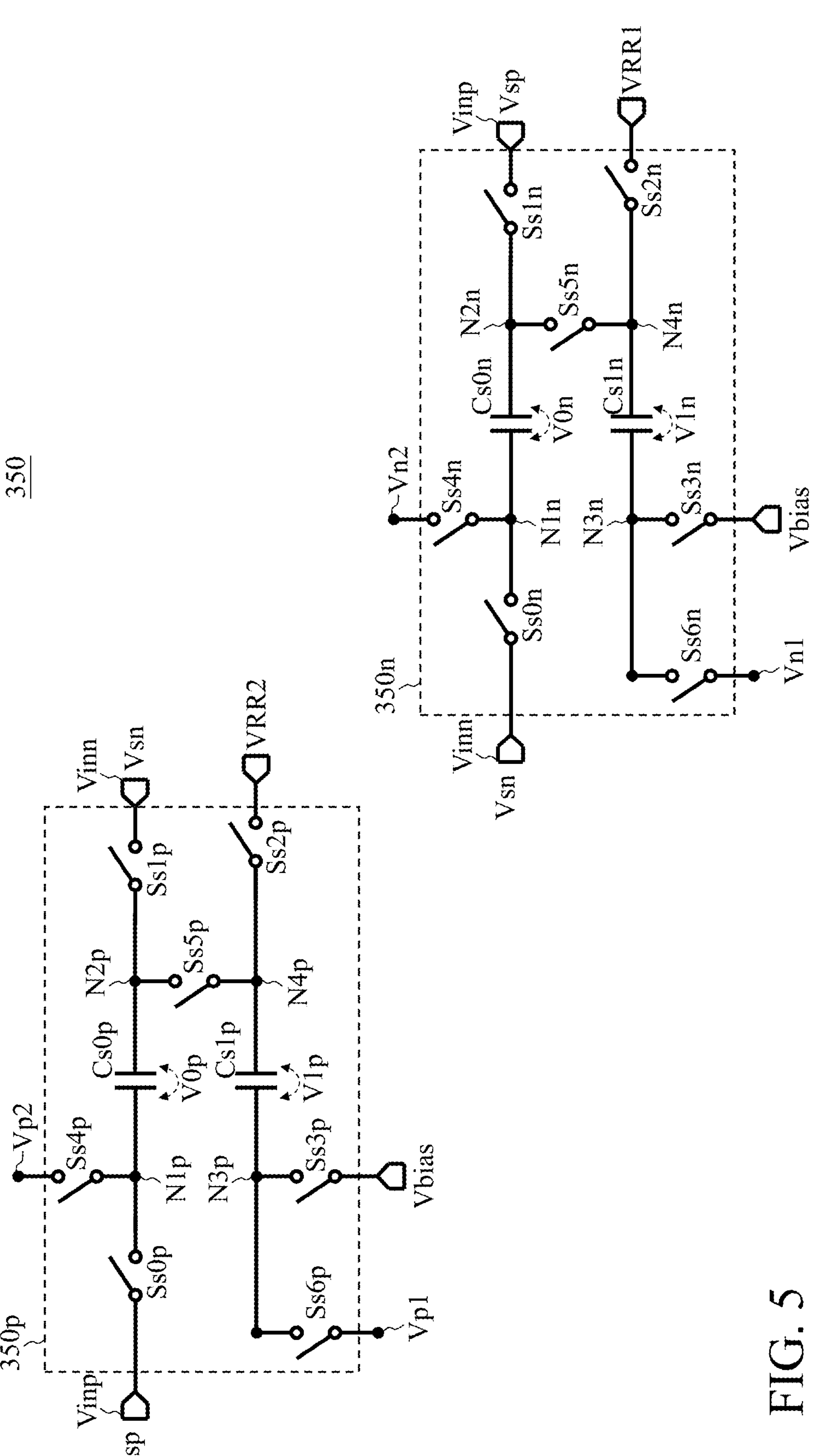
FIG. 5 is the circuit diagram of the amplification and level shifting circuit of FIG. 3 according to an embodiment.

During the phase Φ2 (i.e., when the clock CLK3 is at the first level, and the clocks CLK1 and CLK2 are at the second level), the sampling and amplifying circuit 330*p* and the sampling and amplifying circuit 330*n* perform the amplifying operation, and the amplification and level shifting circuit 350 level shifts the voltage at the output node Vp1 and the voltage at the output terminal Vp2 according to at least the input signal Vsp, the input signal Vsn, the reference voltage VRR1, and the reference voltage VRR2 (which will be discussed in detail below in connection with FIG. 5).

To be more specific, during the phase Φ2, the switch S0*p* (switch S0*n*), the switch S1*p* (switch S1*n*), and the switch S2*p* (switch S2*n*) are turned off, and the switch S3*p* (switch S3*n*), the switch S4*p* (switch S4*n*), and the switch S5*p* (switch S5*n*) are turned on, so that the capacitor C0*p* (capacitor C0*n*) becomes a feedback capacitor, and the capacitor C1*p* (capacitor C1*n*) is coupled between the selection circuit 320 and the operational amplifier 340. The voltages at the output terminal Vp2 and the output terminal Vn2 are respectively shown in Equations (1-1) and (1-2), and the difference between the two is shown in Equation (2).

$$Vp2 = \{[dV*(C0p+C1p)/C0p] - VR1\} + Vdc2 \tag{1-1}$$

$$Vn2 = -\{[-dV*(C0n+C1n)/C0n] - VR2\} + Vdc2 \tag{1-2}$$

$$Vp2 - Vn2 = \{[dV*(C0p+C1p)/C0p] - VR1\} - \{[-dV*(C0n+C1n)/C0n] \tag{2}$$

where the voltage Vdc2 is the DC voltage at the output terminal Vp2 (output terminal Vn2).

In other words, the sampling and amplifying circuit 330*p* (sampling and amplifying circuit 330*n*) amplifies the signal component dV of the input signal Vsp (input signal Vsn) and generates a signal at the output terminal Vp2 (output terminal Vn2).

If C0*p*=C1*p*=C0*n*=C1*n*=1, then the signal component dV is amplified by two times (as shown in Equations (3) and (4)).

$$Vp2 = 2*dV - VR1 + Vdc2 \tag{3}$$

$$Vn2 = -2*dV - VR2 + Vdc2 \tag{4}$$

Reference is made to FIG. 5, which is the circuit diagram of the amplification and level shifting circuit 350 according to an embodiment of the present invention. The amplification and level shifting circuit 350 includes the switched capacitor (SC) circuit 350*p* and the SC circuit 350*n*. The SC circuit 350*p* and the SC circuit 350*n* have corresponding components and each include two capacitors and seven switches. The details are discussed below.

The two terminals of the capacitor Cs0*p* (capacitor Cs0*n*) are the node N1*p* (node N1*n*) and the node N2*p* (node N2*n*), respectively. The two terminals of the capacitor Cs1*p* (capacitor Cs1*n*) are the node N3*p* (node N3*n*) and the node N4*p* (node N4*n*), respectively.

One terminal of the switch Ss0*p* (switch Ss0*n*) receives the input signal Vsp (input signal Vsn) (i.e., coupled or electrically connected to the input terminal Vinp (input terminal Vinn)); the other terminal of the switch Ss0*p* (switch Ss0*n*) is coupled or electrically connected to the node N1*p* (node N1*n*).

One terminal of the switch Ss1*p* (switch Ss1*n*) receives the input signal Vsn (input signal Vsp) (i.e., coupled or electrically connected to the input terminal Vinn (input terminal Vinp)); the other terminal of the switch Ss1_p_ (switch Ss1_n_) is coupled or electrically connected to the node N2_p_ (node N2_n_).

One terminal of the switch Ss2_p_ (switch Ss2_n_) receives the reference voltage VRR2 (reference voltage VRR1) (i.e., coupled or electrically connected to the selection circuit 320); the other terminal of the switch Ss2_p_ (switch Ss2_n_) is coupled or electrically connected to the node N4_p_ (node N4_n_).

One terminal of the switch Ss3_p_ (switch Ss3_n_) receives the DC voltage Vbias; the other terminal of the switch Ss3_p_ (switch Ss3_n_) is coupled or electrically connected to the node N3_p_ (node N3_n_).

One terminal of the switch Ss4_p_ (switch Ss4_n_) is coupled or electrically connected to the output terminal Vp2 (output terminal Vn2); the other terminal of the switch Ss4_p_ (switch Ss4_n_) is coupled or electrically connected to the node N1_p_ (node N1_n_).

One terminal of the switch Ss5_p_ (switch Ss5_n_) is coupled or electrically connected to the node N2_p_ (node N2_n_); the other terminal of the switch Ss5_p_ (switch Ss5_n_) is coupled or electrically connected to the node N4_p_ (node N4_n_).

One terminal of the switch Ss6_p_ (switch Ss6_n_) is coupled or electrically connected to the output node Vp1 (output node Vn1); the other terminal of the switch Ss6_p_ (switch Ss6_n_) is coupled or electrically connected to the node N3_p_ (node N3_n_).

Reference is made to FIG. 4 and FIG. 5. During the phase Φ1, the switch Ss0_p_ (switch Ss0_n_) and the switch Ss1_p_ (switch Ss1_n_) are turned on, and other switches are turned off, so that the capacitor Cs0_p_ (capacitor Cs0_n_) receives the input signal Vsp and the input signal Vsn. Therefore, when the phase Φ1 ends, the voltage V0_p_ (V0_n_) across the capacitor Cs0_p_ (capacitor Cs0_n_) is −2dV (+2dV).

During the phase Φb, the switch Ss2_p_ (switch Ss2_n_) and the switch Ss3_p_ (switch Ss3_n_) are turned on, and other switches are turned off, so that the capacitor Cs1_p_ (capacitor Cs1_n_) receives the reference voltage VR2 (reference voltage VR1) and the DC voltage Vbias. Therefore, when the phase Φb ends, the voltage V1_p_ (V1_n_) across the capacitor Cs1_p_ (capacitor Cs1_n_) is Vbias-VR2 (Vbias-VR1).

During the phase Φ2, the switch Ss4_p_ (switch Ss4_n_), the switch Ss5_p_ (switch Ss5_n_), and the switch Ss6_p_ (switch Ss6_n_) are turned on, and the other switches are turned off, so that a voltage difference Vp21 is generated between the output terminal Vp2 and the output node Vp1 (as shown in Equation (5)), and a voltage difference Vn21 is generated between the output terminal Vn2 and the output node Vn1 (as shown in Equation (6)).

$$Vp21 = Vp2 - Vp1 = 2*dV + (VRR2 - Vbias) \tag{5}$$

$$Vn21 = Vn2 - Vn1 = 2*dV + (VRR1 - Vbias) \tag{6}$$

Based on Equation (3) and Equation (5), Equation (7) can be obtained, and based on Equation (4) and Equation (6), Equation (8) can be obtained.

$$Vp1 = Vp2 - Vp21 = -VR1 + Vdc2 - VRR2 + Vbias \tag{7}$$

$$Vn1 = Vn2 - Vn21 = -VR2 + Vdc2 - VRR1 + Vbias \tag{8}$$

By controlling the selection circuit 320 to make VRR2=−VR1 and VRR1=−VR2, Equation (7) and Equation (8) become Equation (9) and Equation (10), respectively.

$$Vp1 = Vdc2 + Vbias \tag{9}$$

$$Vn1 = Vdc2 + Vbias \tag{10}$$

From Equation (9) and Equation (10), it is evident that the output nodes Vp1 and Vn1 of the operational amplifier 340 do not contain the signal component dV, the preset voltage Vx, the preset voltage Vy, and the common-mode voltage Vcm. Therefore, the operational amplifier 340 can maintain better linearity and gain. That is to say, by sampling the input signal Vsp and the input signal Vsn in advance, the amplification and level shifting circuit 350 can implement the correlated level shifting (CLS) technique (so that the output nodes Vp1 and Vn1 of the operational amplifier 340 do not contain the signal components dV of the input signals Vsp and Vsn), but the MDAC 300 needs only three clocks (i.e., it does not need the estimation phase or the clock CLKe in FIG. 2). Therefore, the MDAC 300 becomes easier to implement, and the circuit speed can be improved.

Figure 6:
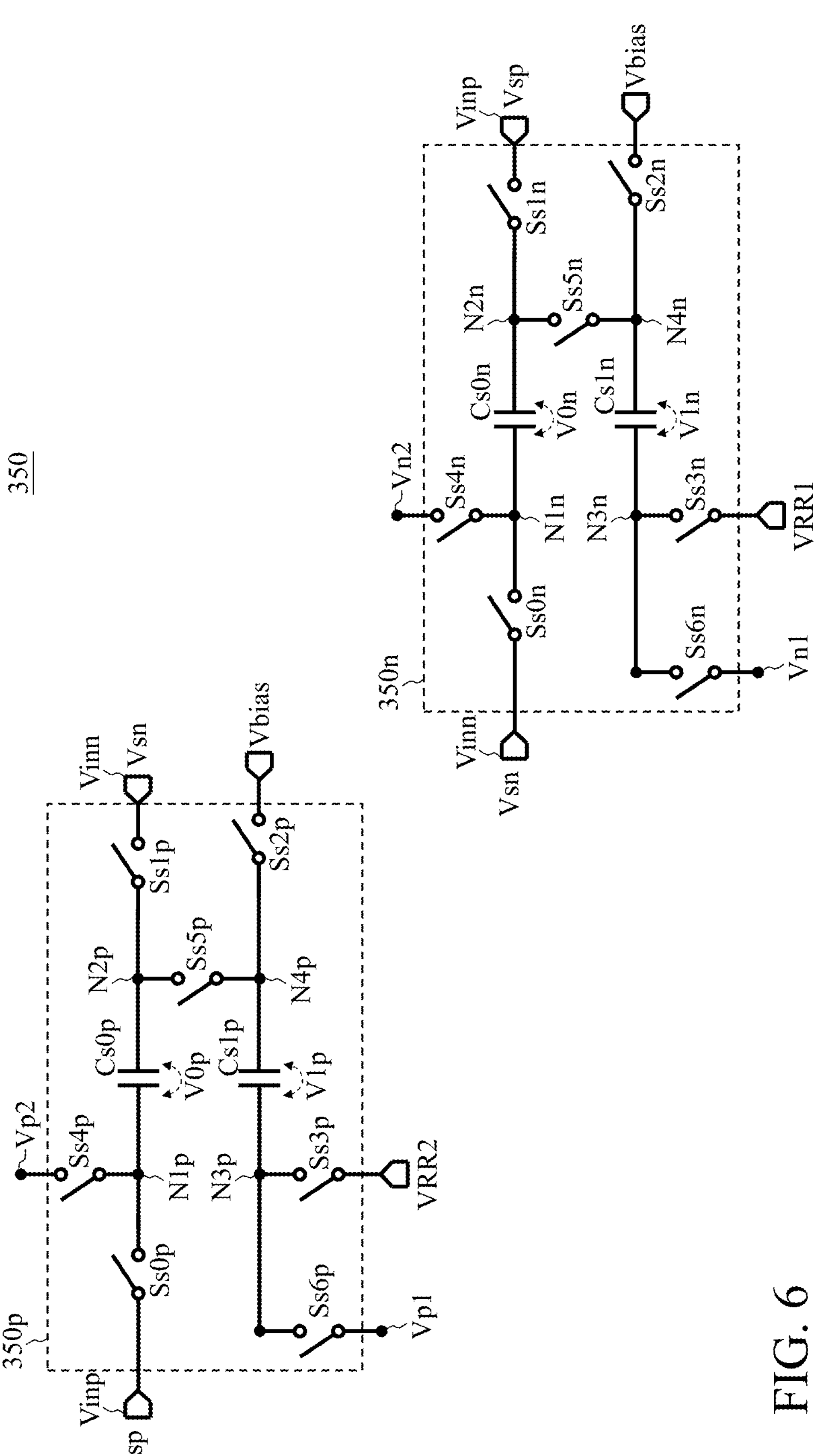
FIG. 6 is the circuit diagram of the amplification and level shifting circuit of FIG. 3 according to another embodiment.

Reference is made to FIG. 6, which is the circuit diagram of the amplification and level shifting circuit 350 according to another embodiment of the present invention. FIG. 6 is similar to FIG. 5, except that the switch Ss2_p_ receives the DC voltage Vbias (instead of the reference voltage VRR2), the switch Ss3_p_ receives the reference voltage VRR2 (instead of the DC voltage Vbias), the switch Ss2_n_ receives the DC voltage Vbias (instead of the reference voltage VRR1), and the switch Ss3_n_ receives the reference voltage VRR1 (instead of the DC voltage Vbias). The circuit in FIG. 6 and the circuit in FIG. 5 can both achieve level shifting.

Figure 7:
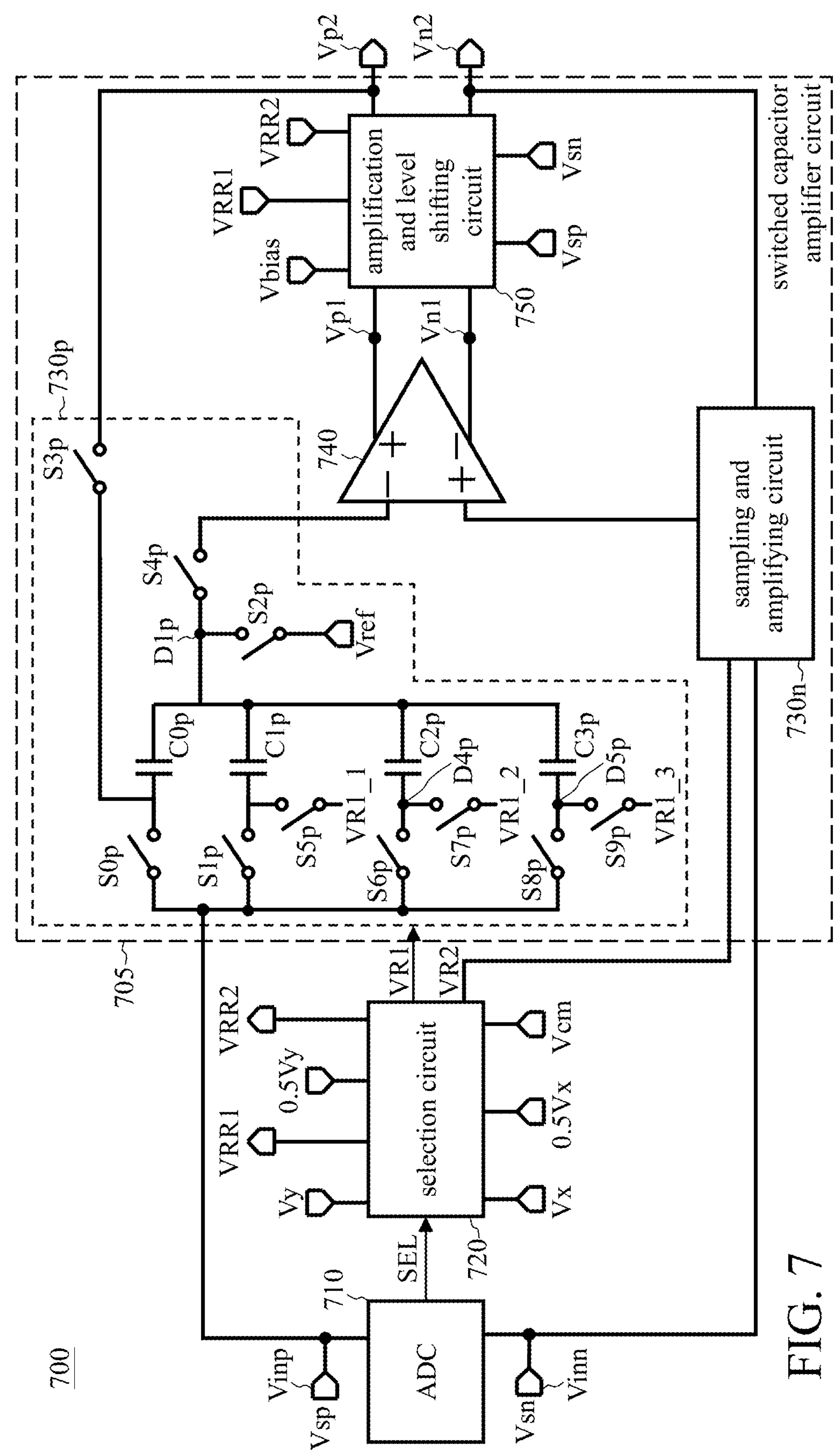
FIG. 7 is the functional block diagram of an MDAC according to another embodiment of the present invention.

Reference is made to FIG. 7, which is a functional block diagram of an MDAC according to another embodiment of the present invention. The MDAC 700 is a 2.5-bit MDAC, which has the input terminal Vinp, the input terminal Vinn, the output terminal Vp2, and the output terminal Vn2. The MDAC 700 includes a capacitor switching amplifier circuit 705, an ADC 710, and a selection circuit 720. The capacitor switching amplifier circuit 705 includes a sampling and amplifying circuit 730_p_, a sampling and amplifying circuit 730_n_, an operational amplifier 740, and an amplification and level shifting circuit 750. The functions of the ADC 710, the selection circuit 720, and the operational amplifier 740 are similar to those of the ADC 310, the selection circuit 320, and the operational amplifier 340, respectively, and the details are omitted for brevity here.

The sampling and amplifying circuit 730_p_ and the sampling and amplifying circuit 730_n_ have corresponding components and each include four capacitors and 10 switches. Compared with the sampling and amplifying circuit 330_p_, the sampling and amplifying circuit 730_p_ further includes a capacitor C2_p_, a capacitor C3_p_, a switch S6_p_, a switch S7_p_, a switch S8_p_, and a switch S9_p_. The reference voltage VR1 includes a reference voltage VR1_1, a reference voltage VR1_2, and a reference voltage VR1_3. The switch S5_p_ receives the reference voltage VR1_1. The reference voltage VR1_1, the reference voltage VR1_2, and the reference voltage VR1_3 are each a voltage selected from the preset voltage Vx, the preset voltage Vy, the common-mode voltage Vcm, 0.5Vx, and 0.5Vy.

The two terminals of the capacitor C2$p$ are the node D1$p$ and the node D4$p$, respectively. The two terminals of the capacitor C3$p$ are the node D1$p$ and the node D5$p$, respectively.

One terminal of the switch S6$p$ is coupled or electrically connected to the input terminal Vinp; the other terminal of the switch S6$p$ is coupled or electrically connected to the node D4$p$.

One terminal of the switch S7$p$ is coupled or electrically connected to the node D4$p$; the other terminal of the switch S7$p$ receives the reference voltage VR1_2 (i.e., coupled or electrically connected to the selection circuit 720).

One terminal of the switch S8$p$ is coupled or electrically connected to the input terminal Vinp; the other terminal of the switch S8$p$ is coupled or electrically connected to the node D5$p$.

One terminal of the switch S9$p$ is coupled or electrically connected to the node D5$p$; the other terminal of the switch S9$p$ receives the reference voltage VR1_3 (i.e., coupled or electrically connected to the selection circuit 720).

The states (turning on or off) of the switches S6$p$ and S8$p$ are the same as that of the switch S0$p$. The states of the switches S7$p$ and S9$p$ are the same as that of the switch S5$p$. As people having ordinary skill in the art can deduce the details of the sampling and amplifying circuit 730$n$ from FIG. 3 and the sampling and amplifying circuit 730$p$, further elaboration is omitted for brevity. As people having ordinary skill in the art can deduce the operating principle of the MDAC 700 from the MDAC 300, further elaboration is omitted for brevity.

Figure 8:
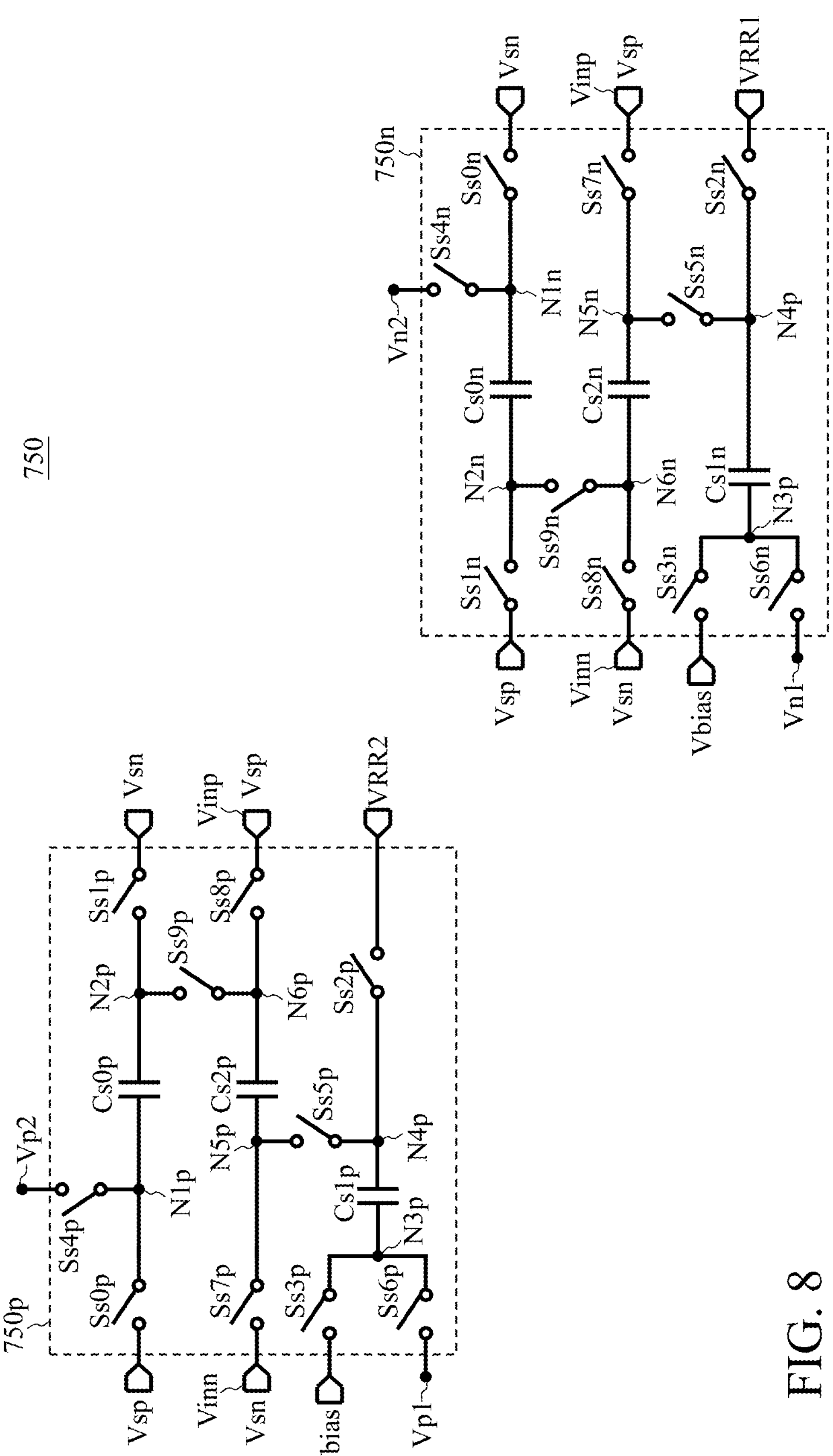
FIG. 8 is the circuit diagram of the amplification and level shifting circuit of FIG. 7 according to an embodiment.

Reference is made to FIG. 8, which is the circuit diagram of the amplification and level shifting circuit 750 according to an embodiment of the present invention. The amplification and level shifting circuit 750 includes an SC circuit 750$p$ and an SC circuit 750$n$. The SC circuit 750$p$ (SC circuit 750$n$) is similar to the SC circuit 350$p$ (SC circuit 350$n$), except that the SC circuit 750$p$ (SC circuit 750$n$) further includes a capacitor Cs2$p$ (capacitor Cs2$n$), a switch Ss7$p$ (switch Ss7$n$), a switch Ss8$p$ (switch Ss8$n$), and a switch Ss9$p$ (switch Ss9$n$).

The two terminals of the capacitor Cs2$p$ (capacitor Cs2$n$) are the node N5$p$ (node N5$n$) and the node N6$p$ (node N6$n$), respectively.

One terminal of the switch Ss7$p$ (switch Ss7$n$) is coupled or electrically connected to the input terminal Vinn (input terminal Vinp); the other terminal of the switch Ss7$p$ (switch Ss7$n$) is coupled or electrically connected to the node N5$p$ (node N5$n$).

One terminal of the switch Ss8$p$ (switch Ss8$n$) is coupled or electrically connected to the input terminal Vinp (input terminal Vinn); one terminal of the switch Ss8$p$ (switch Ss8$n$) is coupled or electrically connected to the node N6$p$ (node N6$n$).

One terminal of the switch Ss9$p$ (switch Ss9$n$) is coupled or electrically connected to the node N2$p$ (node N2$n$); one terminal of the switch Ss9$p$ (switch Ss9$n$) is coupled or electrically connected to the node N6$p$ (node N6$n$).

The states of the switch Ss7$p$ (switch Ss7$n$) and the switch Ss8$p$ (switch Ss8$n$) are the same as that of the switch Ss0$p$ (switch Ss0$n$). The state of the switch Ss9$p$ (switch Ss9$n$) is the same as that of the switch Ss5$p$ (switch Ss5$n$). The SC circuit 750$p$ and the SC circuit 750$n$ can amplify the signal component dV of the input signal Vsp or the input signal Vsn by four times. As people having ordinary skill in the art can deduce the operating principle of the amplification and level shifting circuit 750 from the amplification and level shifting circuit 350, further elaboration is omitted for brevity.

Figure 9:
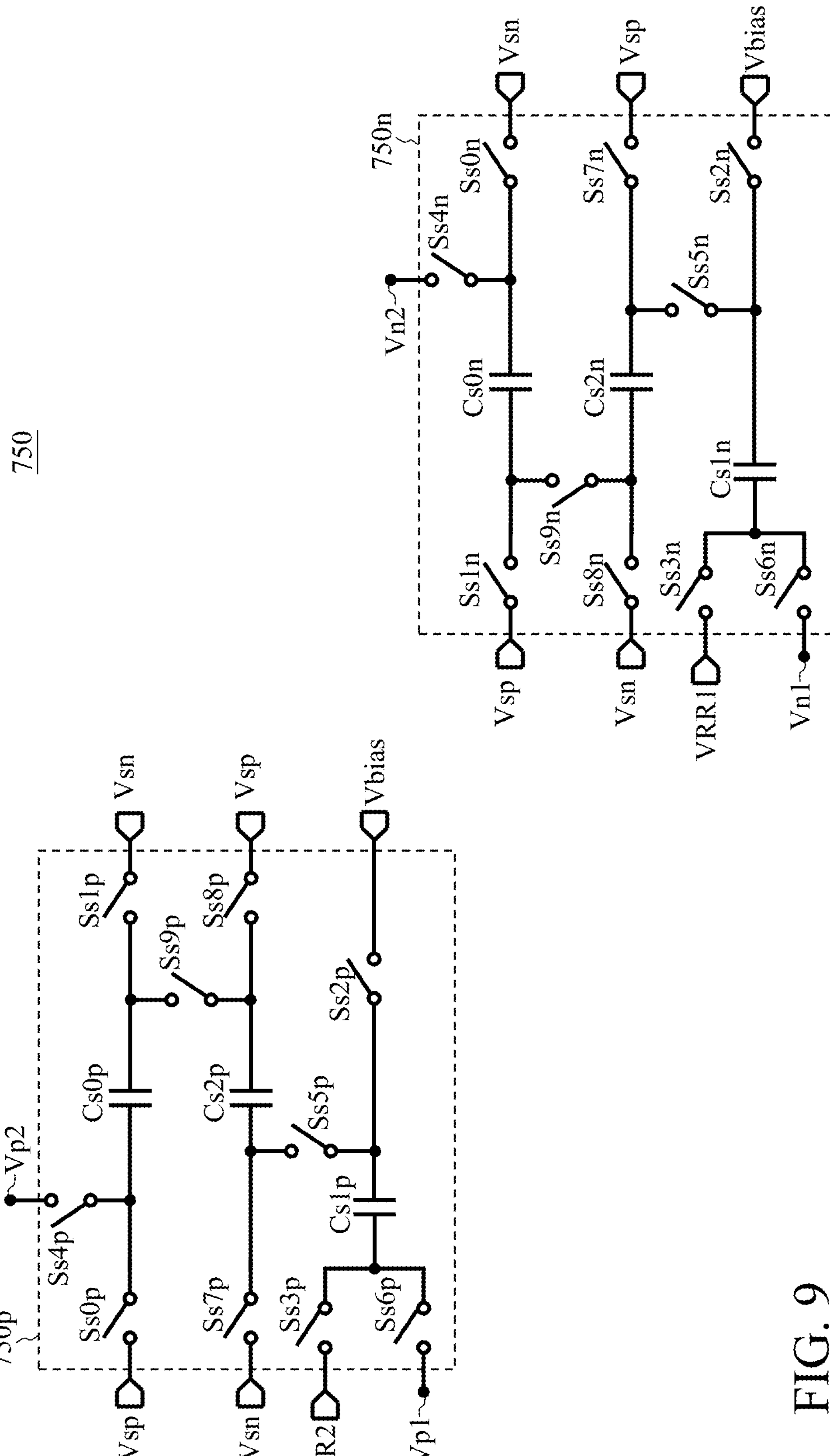
FIG. 9 is the circuit diagram of the amplification and level shifting circuit of FIG. 7 according to another embodiment.

Reference is made to FIG. 9, which is the circuit diagram of the amplification and level shifting circuit 750 according to another embodiment of the present invention. FIG. 9 is similar to FIG. 8, except that the switch Ss2$p$ receives the DC voltage Vbias (instead of the reference voltage VRR2), the switch Ss3$p$ receives the reference voltage VRR2 (instead of the DC voltage Vbias), the switch Ss2$n$ receives the DC voltage Vbias (instead of the reference voltage VRR1), and the switch Ss3$n$ receives the reference voltage VRR1 (instead of the DC voltage Vbias). The circuit in FIG. 9 and the circuit in FIG. 8 can both achieve level shifting.

Figure 1A:
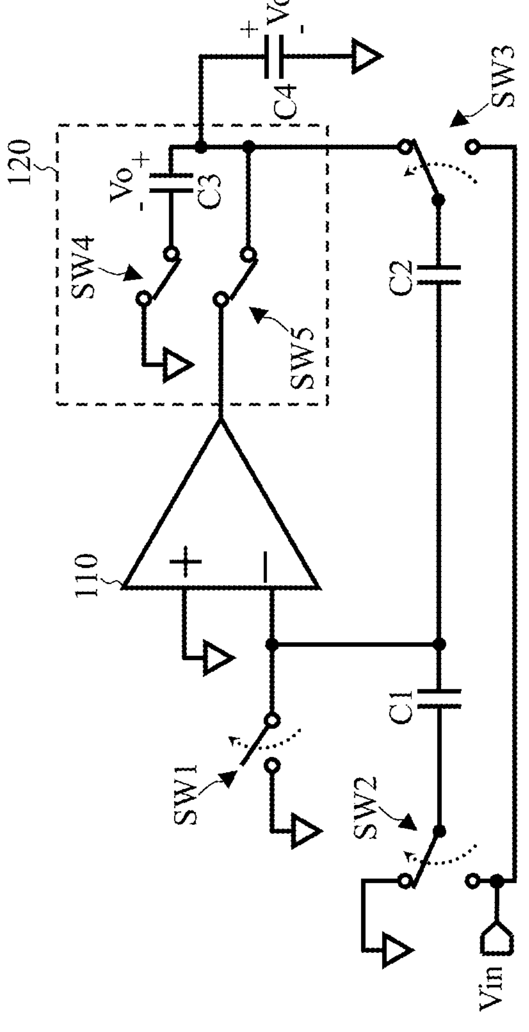
FIG. 1A is a circuit diagram of a conventional correlated level shifting (CLS) switched capacitor (SC) circuit.
Figure 1B:
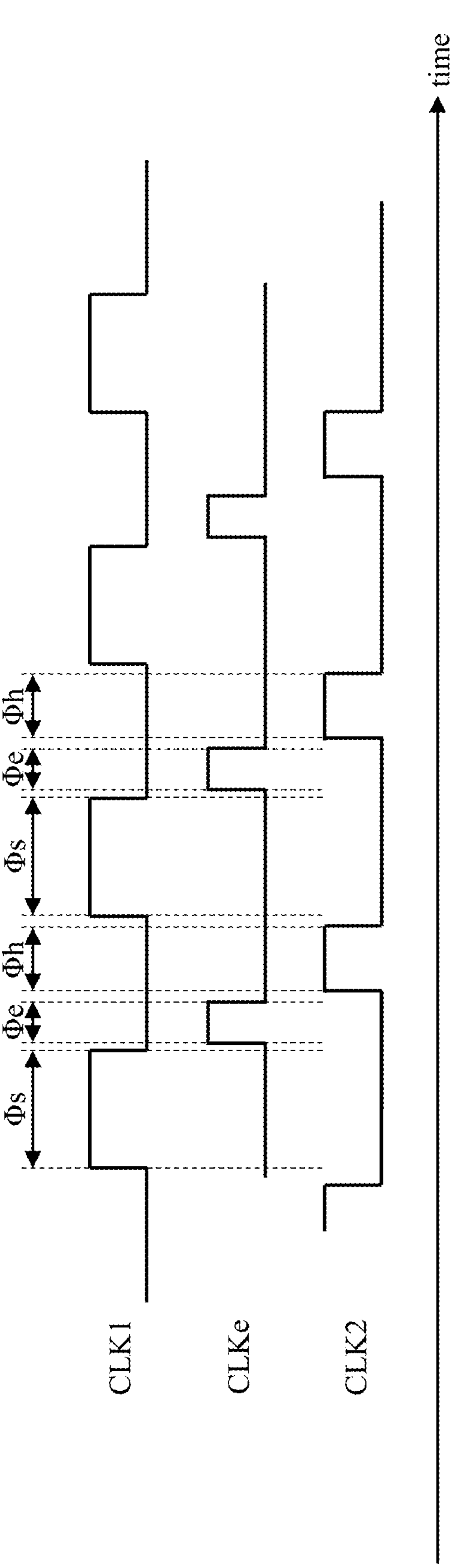
FIG. 1B shows the waveform of multiple clocks.
Figure 2:
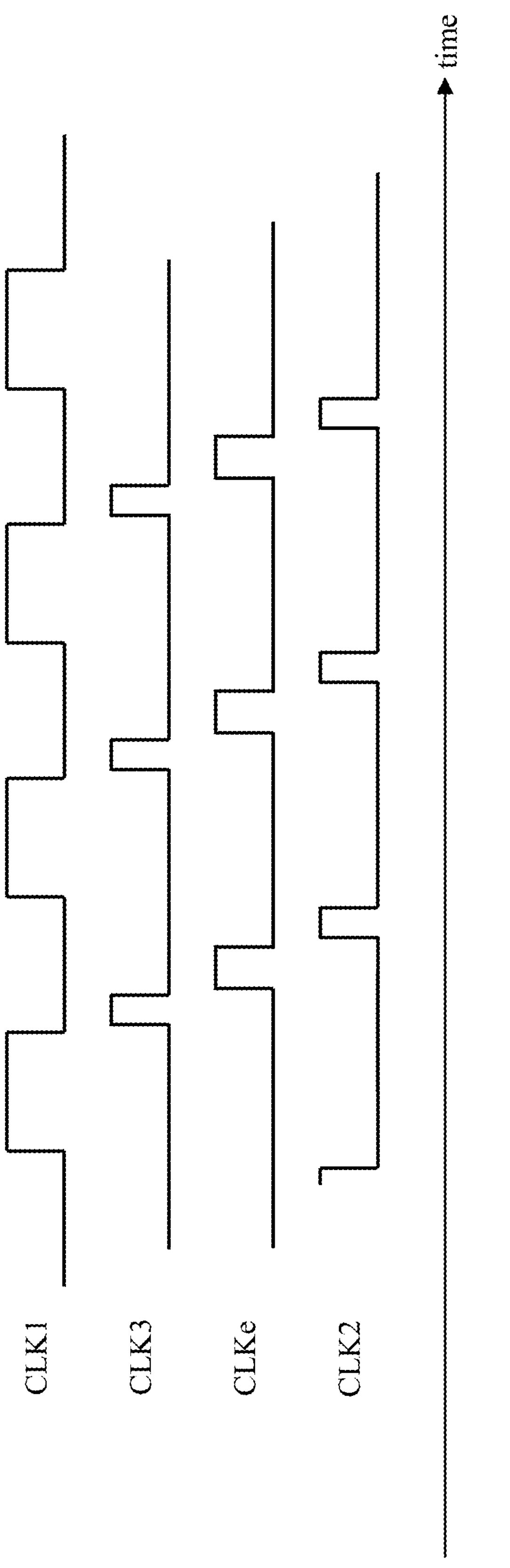
FIG. 2 shows the waveform of multiple clocks.

Similarly, the amplification and level shifting circuit 750 of the MDAC 700 can implement the CLS technique, but the MDAC 700 needs only three clocks (i.e., it does not need the estimation phase or the clock CLKe in FIG. 2). Therefore, the MDAC 700 becomes easier to implement, and the circuit speed can be improved.

Figure 10:
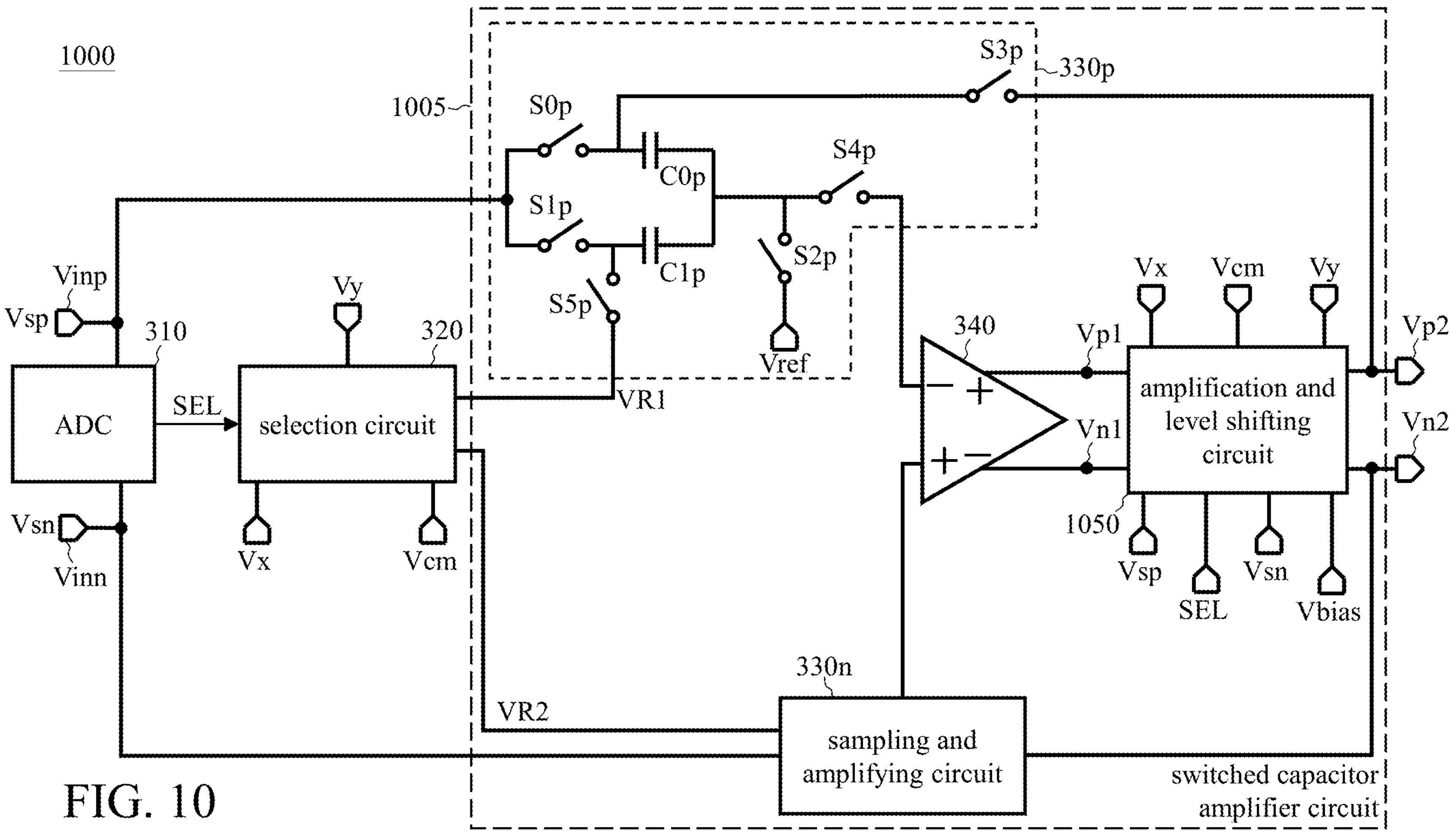
FIG. 10 is the functional block diagram of an MDAC according to another embodiment of the present invention.

Reference is made to FIG. 10, which is a functional block diagram of an MDAC according to another embodiment of the present invention. The MDAC 1000 is similar to the MDAC 300, except that the amplification and level shifting circuit 1050 is different from the amplification and level shifting circuit 350 (hence, the capacitor switching amplifier circuit 1005 is different from the capacitor switching amplifier circuit 305).

Figure 11:
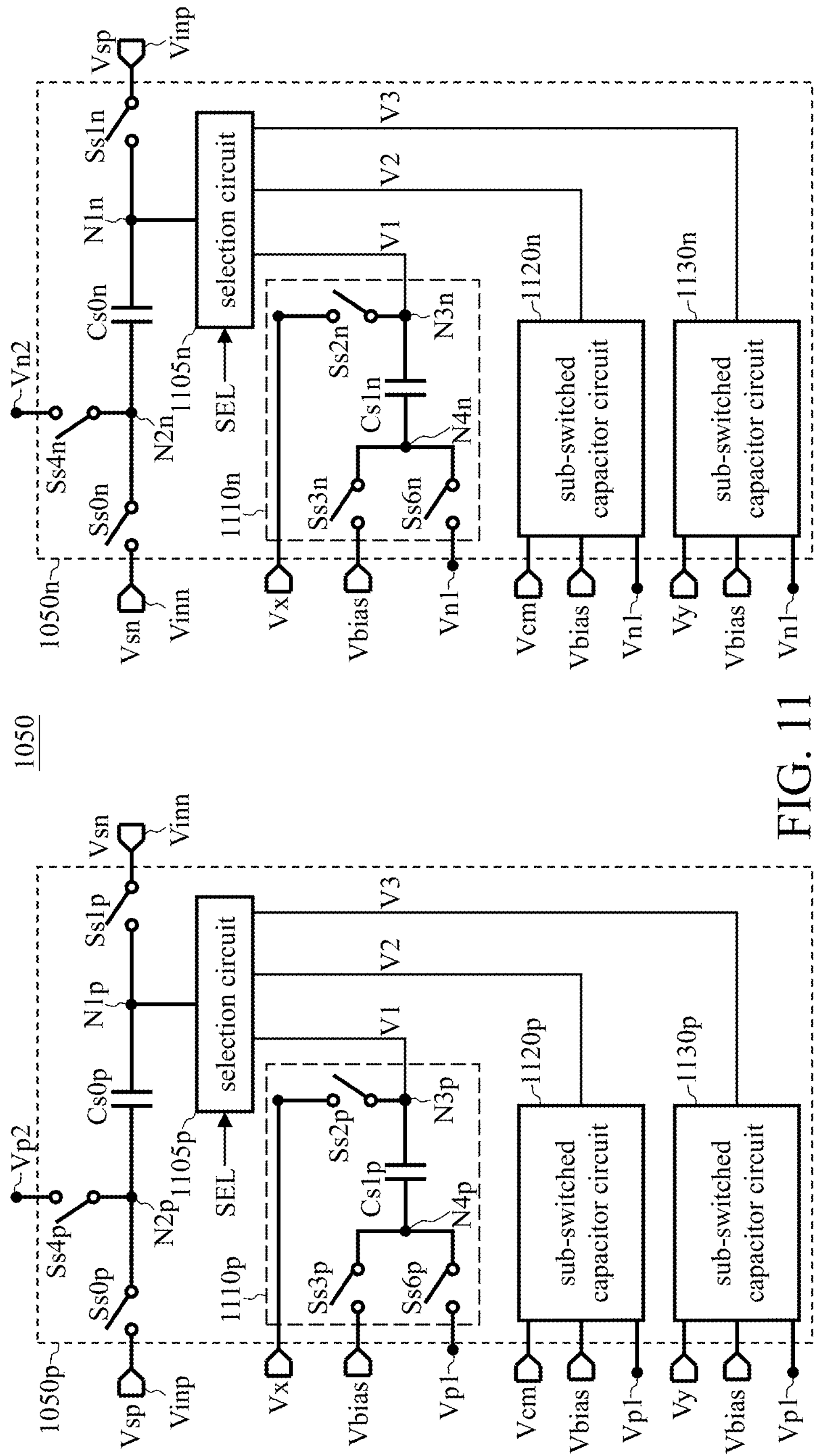
FIG. 11 is the circuit diagram of the amplification and level shifting circuit of FIG. 10 according to an embodiment.

Reference is made to FIG. 11, which is the circuit diagram of the amplification and level shifting circuit 1050 according to an embodiment of the present invention. The amplification and level shifting circuit 1050 includes an SC circuit 1050$p$ and an SC circuit 1050$n$. The SC circuit 1050$p$ and the SC circuit 1050$n$ have corresponding components and each include a capacitor, three switches, a selection circuit, and three sub-SC circuits. The details are discussed below.

The SC circuit 1050$p$ (SC circuit 1050$n$) includes a capacitor Cs0$p$ (capacitor Cs0$n$), a switch Ss0$p$ (switch Ss0$n$), a switch Ss1$p$ (switch Ss1$n$), a switch Ss4$p$ (switch Ss4$n$), a selection circuit 1105$p$ (selection circuit 1105$n$), a sub-SC circuit 1110$p$ (sub-SC circuit 1110$n$), a sub-SC circuit 1120$p$ (sub-SC circuit 1120$n$), and a sub-SC circuit 1130$p$ (sub-SC circuit 1130$n$). The sub-SC circuit 1110$p$, the sub-SC circuit 1120$p$, and the sub-SC circuit 1130$p$ are substantially the same, each including a capacitor (capacitor Cs1$p$) and three switches (switches Ss2$p$, Ss3$p$, and Ss6$p$). The sub-SC circuit 1110$n$, the sub-SC circuit 1120$n$ and the sub-SC circuit 1130$n$ are substantially the same, each including a capacitor (capacitor Cs1$n$) and three switches (switches Ss2$n$, Ss3$n$, and Ss6$n$). The sub-SC circuit 1110$p$ and the sub-SC circuit 1110$n$ are substantially the same.

The sub-SC circuit 1110$p$ (sub-SC circuit 1120$p$, sub-SC circuit 1130$p$) is coupled between the selection circuit 1105$p$ and the output node Vp1 and configured to generate the candidate voltage V1 (candidate voltage V2, candidate voltage V3) according to the DC voltage Vbias and the preset voltage Vx (common-mode voltage Vcm, preset voltage Vy). The same applies to the sub-SC circuit 1110$n$, the sub-SC circuit 1120$n$, and the sub-SC circuit 1130$n$; details are omitted for brevity.

The two terminals of the capacitor Cs0$p$ (capacitor Cs0$n$) are the node N1$p$ (node N1$n$) and the node N2$p$ (node N2$n$), respectively. The two terminals of the capacitor Cs1$p$ (capacitor Cs1$n$) are the node N3$p$ (node N3$n$) and the node N4$p$ (node N4$n$), respectively.

One terminal of the switch Ss0$p$ (switch Ss0$n$) is coupled or electrically connected to the input terminal Vinp (input terminal Vinn); the other terminal of the switch Ss0*p* (switch Ss0*n*) is coupled or electrically connected to the node N2*p* (node N2*n*).

One terminal of the switch Ss1*p* (switch Ss1*n*) is coupled or electrically connected to the node N1*p* (node N1*n*); the other terminal of the switch Ss1*p* (switch Ss1*n*) is coupled or electrically connected to the input terminal Vinn (input terminal Vinp).

One terminal of the switch Ss2*p* (switch Ss2*n*) is coupled or electrically connected to the node N3*p* (node N3*n*). For the sub-SC circuit 1110*p* and the sub-SC circuit 1110*n*, the other terminal of the switch Ss2*p* (switch Ss2*n*) receives the preset voltage Vx. For the sub-SC circuit 1120*p* and the sub-SC circuit 1120*n*, the other terminal of the switch Ss2*p* (switch Ss2*n*) receives the preset voltage Vcm. For the sub-SC circuit 1130*p* and the sub-SC circuit 1130*n*, the other terminal of the switch Ss2*p* (switch Ss2*n*) receives the preset voltage Vy.

One terminal of the switch Ss3*p* (switch Ss3*n*) is coupled or electrically connected to the node N4*p* (node N4*n*); the other terminal of the switch Ss3*p* (switch Ss3*n*) receives the DC voltage Vbias.

One terminal of the switch Ss4*p* (switch Ss4*n*) is coupled or electrically connected to the node N2*p* (node N2*n*); the other terminal of the switch Ss4*p* (switch Ss4*n*) is coupled or electrically connected to the output terminal Vp2 (output terminal Vn2).

One terminal of the switch Ss6*p* (switch Ss6*n*) is coupled or electrically connected to the node N4*p* (node N4*n*); the other terminal of the switch Ss6*p* (switch Ss6*n*) is coupled or electrically connected to the output node Vp1 (output node Vn1).

The SC circuit 1050*p* and the SC circuit 1050*n* operate according to the clocks in FIG. 4. The switch Ss0*p*, the switch Ss0*n*, the switch Ss1*p*, and the switch Ss1*n* are turned on during the phase 1 and turned off at other times. The switch Ss2*p*, the switch Ss2*n*, the switch Ss3*p*, and the switch Ss3*n* are turned on during the phase (b and turned off at other times. The switch Ss4*p*, the switch Ss4*n*, the switch Ss6*p*, and the switch Ss6*n* are turned on during the phase Φ2 and turned off at other times.

During the phase Φ2, the selection circuit 1105*p* (selection circuit 1105*n*) couples or electrically connects the node N1*p* (node N1*n*) to the node N3*p* (node N3*n*) of one of the sub-SC circuit 1110*p* (sub-SC circuit 1110*n*), the sub-SC circuit 1120*p* (sub-SC circuit 1120*n*), and the sub-SC circuit 1130*p* (sub-SC circuit 1130*n*) according to the selection signal SEL (i.e., output one of the candidate voltages V1, V2, and V3 to the node N1*p* (node N1*n*) according to the selection signal SEL). During any period other than the phase Φ2, the selection circuit 1105*p* (selection circuit 1105*n*) does not couple or electrically connect the node N1*p* (node N1*n*) to the node N3*p* (node N3*n*) of any one of the sub-SC circuit 1110*p* (sub-SC circuit 1110*n*), the sub-SC circuit 1120*p* (sub-SC circuit 1120*n*), and the sub-SC circuit 1130*p* (sub-SC circuit 1130*n*).

The purpose and function of the amplification and level shifting circuit 1050 are substantially the same as the purpose and function of the amplification and level shifting circuit 350. However, compared with the amplification and level shifting circuit 350, the amplification and level shifting circuit 1050 can shorten the duration of the phase Φb. Consequently, the amplification and level shifting circuit 1050 operates faster (i.e., the MDAC 1000 operates faster).

In an alternative embodiment, the switch Ss2*p*, the switch Ss2*n*, the switch Ss3*p*, and the switch Ss3*n* are turned on during the phase Φ1 and turned off at other times. That is to say, the amplification and level shifting circuit 1050 can operate according to only the clock CLK1 and the clock CLK3, further improving the operating speed of the MDAC 1000.

Figure 12:
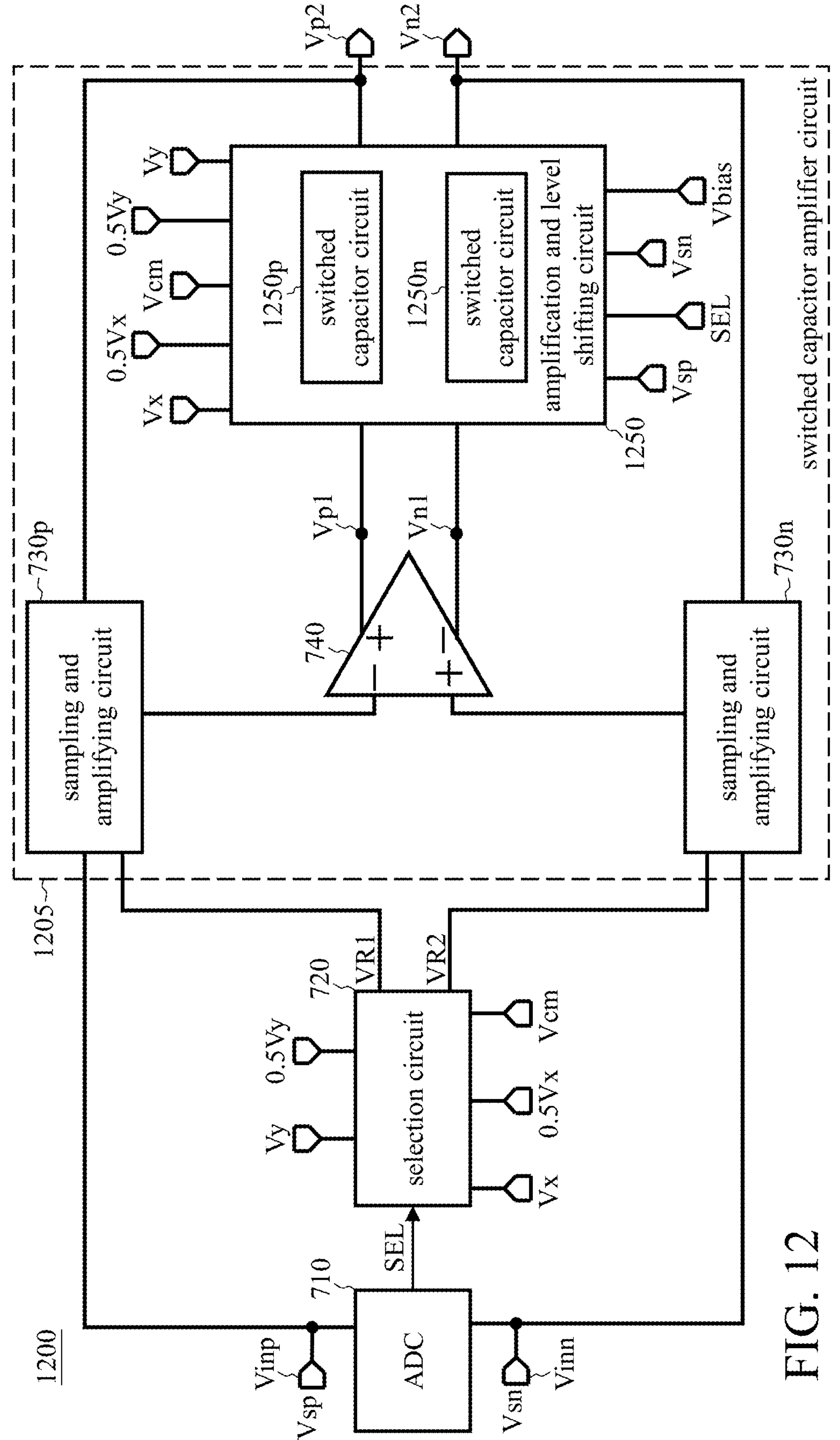
FIG. 12 is the functional block diagram of an MDAC according to another embodiment of the present invention.

Reference is made to FIG. 12, which is a functional block diagram of an MDAC according to another embodiment of the present invention. The MDAC 1200 is similar to the MDAC 700, except that the amplification and level shifting circuit 1250 is different from the amplification and level shifting circuit 750 (hence, the capacitor switching amplifier circuit 1205 is different from the capacitor switching amplifier circuit 705). The amplification and level shifting circuit 1250 includes an SC circuit 1250*p* and an SC circuit 1250*n*. The SC circuit 1250*p* is coupled to the output node Vp1 and the output terminal Vp2, and the SC circuit 1250*n* is coupled to the output node Vn1 and the output terminal Vn2.

Figure 13:
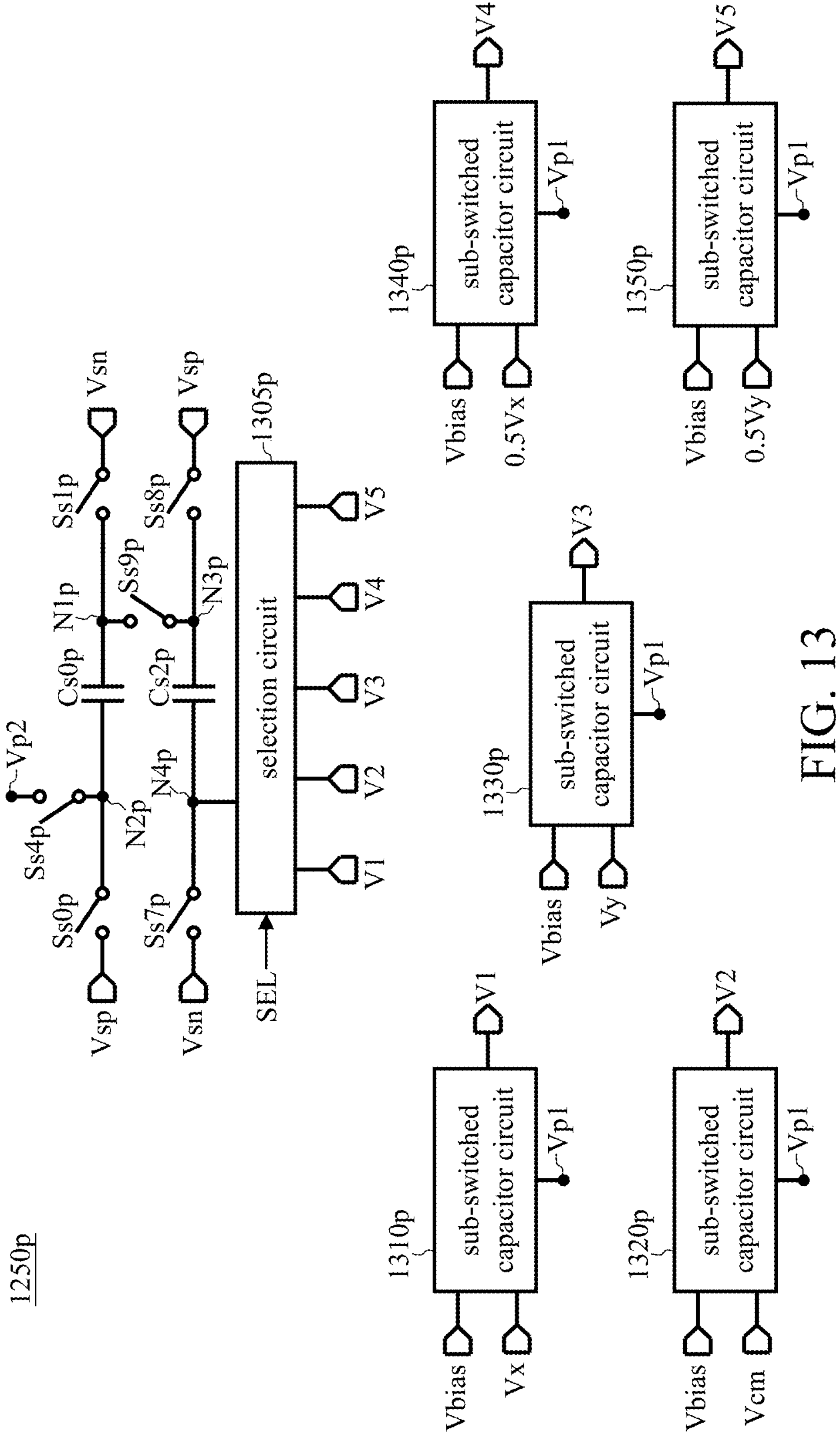
FIG. 13 is the circuit diagram of the SC circuit of FIG. 12 according to an embodiment.

Reference is made to FIG. 13, which is a circuit diagram of the SC circuit 1250*p* according to an embodiment of the present invention. The SC circuit 1250*p* includes a capacitor Cs0*p*, a capacitor Cs2*p*, a switch Ss0*p*, a switch Ss1*p*, a switch Ss4*p*, a switch Ss7*p*, a switch Ss8*p*, a switch Ss9*p*, a selection circuit 1305*p*, a sub-SC circuit 1310*p*, a sub-SC circuit 1320*p*, a sub-SC circuit 1330*p*, a sub-SC circuit 1340*p*, and a sub-SC circuit 1350*p*. The sub-SC circuit 1310*p*, the sub-SC circuit 1320*p*, the sub-SC circuit 1330*p*, the sub-SC circuit 1340*p*, and the sub-SC circuit 1350*p* are substantially identical to the sub-SC circuit 1110*p* and output the candidate voltages V1, V2, V3, V4, and V5, respectively. The selection circuit 1305*p* outputs one of the candidate voltages V1, V2, V3, V4, and V5 to the node N4*p* according to the selection signal SEL.

As people having ordinary skill in the art can deduce the operating principle of the SC circuit 1250*p* from the descriptions of FIGS. 8 and 11, further elaboration is omitted for brevity. As people having ordinary skill in the art can understand the internal circuit of the SC circuit 1250*n* according to FIGS. 11 and 13, further elaboration is omitted for brevity. In other words, the MDAC 1200 can operate based on only three clocks (as shown in FIG. 4, the clock CLKe or estimation phase is not needed); alternatively, similar to the MDAC 1000, the MDAC 1200 can even operate based on only two clocks.

The 1.5-bit MDAC and the 2.5-bit MDAC are intended to illustrate the invention by way of example and not to limit the scope of the claimed invention. People having ordinary skill in the art may apply the present invention to MDACs of more bits (where the number of preset voltages increases accordingly) in accordance with the foregoing discussions.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A multiplying digital-to-analog converter (MDAC) having a first input terminal, a second input terminal, a first output terminal, and a second output terminal, the MDAC comprising:

an analog-to-digital converter (ADC) coupled to the first input terminal and the second input terminal and configured to generate a selection signal according to a first input signal and a second input signal;

a selection circuit coupled to the ADC and configured to select a first reference voltage and a second reference voltage from a plurality of preset voltages according to the selection signal;

a first sampling and amplifying circuit coupled to the selection circuit and the first input terminal and configured to sample and amplify the first input signal according to the first reference voltage;

a second sampling and amplifying circuit coupled to the selection circuit and the second input terminal and configured to sample and amplify the second input signal according to the second reference voltage;

an operational amplifier coupled to the first sampling and amplifying circuit and the second sampling and amplifying circuit and having a first output node and a second output node; and an amplification and level shifting circuit coupled to the first output node, the second output node, the first output terminal, the second output terminal, the first input terminal, the second input terminal, and the selection circuit and configured to amplify the first input signal and the second input signal and to level shift a voltage at the first output node and a voltage at the second output node.

2. The MDAC of claim 1, wherein the first sampling and amplifying circuit and the second sampling and amplifying circuit each comprise:

a first capacitor having a first terminal and a second terminal;

a second capacitor having a third terminal and a fourth terminal;

a first switch coupled between the first terminal and the first input terminal or the second input terminal;

a second switch coupled between the third terminal and the first input terminal or the second input terminal;

a third switch coupled between a third reference voltage and the second terminal or the fourth terminal;

a fourth switch coupled between the first terminal and the first output terminal or the second output terminal;

a fifth switch coupled between the operational amplifier and the second terminal or the fourth terminal; and a sixth switch coupled between the third terminal and the selection circuit.

3. The MDAC of claim 2, wherein the selection circuit further selects a fourth reference voltage and a fifth reference voltage from the plurality of preset voltages according to the selection signal, the amplification and level shifting circuit comprises a first switched capacitor (SC) circuit and a second SC circuit, the first SC circuit is coupled to the first output node and the first output terminal, the second SC circuit is coupled to the second output node and the second output terminal, the first sampling and amplifying circuit amplifies the first input signal according to the first reference voltage, the second sampling and amplifying circuit amplifies the second input signal according to the second reference voltage, the first SC circuit level shifts a voltage at the first output node according to the fifth reference voltage, and the second SC circuit level shifts a voltage at the second output node according to the fourth reference voltage.

4. The MDAC of claim 2, wherein the selection circuit further selects a fourth reference voltage and a fifth reference voltage from the plurality of preset voltages according to the selection signal, the amplification and level shifting circuit comprises a first switched capacitor (SC) circuit and a second SC circuit, and the first SC circuit and the second SC circuit each comprise:

a third capacitor having a fifth terminal and a sixth terminal;

a fourth capacitor having a seventh terminal and an eighth terminal;

a seventh switch coupled to the fifth terminal and receiving the first input signal or the second input signal;

an eighth switch coupled to the sixth terminal and receiving the first input signal or the second input signal;

a ninth switch coupled to the eighth terminal and receiving one of the fourth reference voltage, the fifth reference voltage, and a direct current (DC) voltage;

a tenth switch coupled to the seventh terminal and receiving one of the fourth reference voltage, the fifth reference voltage, and the DC voltage;

an eleventh switch coupled between the fifth terminal and the first output terminal or the second output terminal;

a twelfth switch coupled to the eighth terminal; and a thirteenth switch coupled between the seventh terminal and the first output node or the second output node.

5. The MDAC of claim 4, wherein the first SC circuit and the second SC circuit each further comprise:

a fifth capacitor having a ninth terminal and a tenth terminal;

a fourteenth switch coupled to the ninth terminal and receiving the first input signal or the second input signal;

a fifteenth switch coupled to the tenth terminal and receiving the first input signal or the second input signal; and a sixteenth switch coupled between the sixth terminal and the tenth terminal.

6. The MDAC of claim 2, wherein the selection circuit is a first selection circuit, the amplification and level shifting circuit comprises a first switched capacitor (SC) circuit and a second SC circuit, and the first SC circuit and the second SC circuit each comprise:

a third capacitor having a fifth terminal and a sixth terminal;

a seventh switch coupled to the sixth terminal and receiving the first input signal or the second input signal;

an eighth switch coupled to the fifth terminal and receiving the first input signal or the second input signal;

a ninth switch coupled between the sixth terminal and the first output terminal or the second output terminal;

a second selection circuit coupled to the fifth terminal;

a first sub-SC circuit coupled to the second selection circuit and one of the first output node and the second output node and configured to generate a first candidate voltage according to a first preset voltage and a direct current (DC) voltage;

a second sub-SC circuit coupled to the second selection circuit and one of the first output node and the second output node and configured to generate a second candidate voltage according to a second preset voltage and the DC voltage; and a third sub-SC circuit coupled to the second selection circuit and one of the first output node and the second output node and configured to generate a third candidate voltage according to a third preset voltage and the DC voltage.

7. The MDAC of claim 6, wherein the second selection circuit is electrically connected to the fifth terminal and outputs one of the first candidate voltage, the second candidate voltage, and the third candidate voltage to the fifth terminal according to the selection signal.

8. The MDAC of claim 6, wherein the first SC circuit and the second SC circuit each further comprise:

a fourth capacitor having a seventh terminal and an eighth terminal;

a tenth switch coupled to the eighth terminal and receiving the first input signal or the second input signal;

an eleventh switch coupled to the seventh terminal and receiving the first input signal or the second input signal;

a twelfth switch coupled between the fifth terminal and the seventh terminal;

a fourth sub-SC circuit coupled to the second selection circuit and one of the first output node and the second output node and configured to generate a fourth candidate voltage according to a fourth preset voltage and the DC voltage; and a fifth sub-SC circuit coupled to the second selection circuit and one of the first output node and the second output node and configured to generate a fifth candidate voltage according to a fifth preset voltage and the DC voltage;

wherein the second selection circuit is electrically connected to the eighth terminal and outputs one of the first candidate voltage, the second candidate voltage, the third candidate voltage, the fourth candidate voltage, and the fifth candidate voltage to the eighth terminal according to the selection signal.

9. The MDAC of claim 1, wherein the selection circuit further selects a third reference voltage and a fourth reference voltage from the plurality of preset voltages according to the selection signal, the amplification and level shifting circuit comprises a first switched capacitor (SC) circuit and a second SC circuit, the first SC circuit is coupled to the first output node and the first output terminal, the second SC circuit is coupled to the second output node and the second output terminal, the first sampling and amplifying circuit amplifies the first input signal according to the first reference voltage, the second sampling and amplifying circuit amplifies the second input signal according to the second reference voltage, the first SC circuit level shifts a voltage at the first output node according to the fourth reference voltage, and the second SC circuit level shifts a voltage at the second output node according to the third reference voltage.

10. The MDAC of claim 1, wherein the selection circuit further selects a third reference voltage and a fourth reference voltage from the plurality of preset voltages according to the selection signal, the amplification and level shifting circuit comprises a first switched capacitor (SC) circuit and a second SC circuit, and the first SC circuit and the second SC circuit each comprise:

a first capacitor having a first terminal and a second terminal;

a second capacitor having a third terminal and a fourth terminal;

a first switch coupled to the first terminal and receiving the first input signal or the second input signal;

a second switch coupled to the second terminal and receiving the first input signal or the second input signal;

a third switch coupled to the fourth terminal and receiving one of the third reference voltage, the fourth reference voltage, and a direct current (DC) voltage;

a fourth switch coupled to the third terminal and receiving one of the third reference voltage, the fourth reference voltage, and the DC voltage;

a fifth switch coupled between the first terminal and the first output terminal or the second output terminal;

a sixth switch coupled to the fourth terminal; and a seventh switch coupled between the third terminal and the first output node or the second output node.

11. The MDAC of claim 10, wherein the first SC circuit and the second SC circuit each further comprise:

a third capacitor having a fifth terminal and a sixth terminal;

an eighth switch coupled to the fifth terminal and receiving the first input signal or the second input signal;

a ninth switch coupled to the sixth terminal and receiving the first input signal or the second input signal; and a tenth switch coupled between the second terminal and the sixth terminal.

12. The MDAC of claim 1, wherein the selection circuit is a first selection circuit, the amplification and level shifting circuit comprises a first switched capacitor (SC) circuit and a second SC circuit, and the first SC circuit and the second SC circuit each comprise:

a capacitor having a first terminal and a second terminal;

a first switch coupled to the second terminal and receiving the first input signal or the second input signal;

a second switch coupled to the first terminal and receiving the first input signal or the second input signal;

a third switch coupled between the second terminal and the first output terminal or the second output terminal;

a second selection circuit coupled to the first terminal;

a first sub-SC circuit coupled to the second selection circuit and one of the first output node and the second output node and configured to generate a first candidate voltage according to a first preset voltage and a direct current (DC) voltage;

a second sub-SC circuit coupled to the second selection circuit and one of the first output node and the second output node and configured to generate a second candidate voltage according to a second preset voltage and the DC voltage; and a third sub-SC circuit coupled to the second selection circuit and one of the first output node and the second output node and configured to generate a third candidate voltage according to a third preset voltage and the DC voltage.

13. The MDAC of claim 12, wherein the second selection circuit is electrically connected to the first terminal and outputs one of the first candidate voltage, the second candidate voltage, and the third candidate voltage to the first terminal according to the selection signal.

14. The MDAC of claim 12, wherein the capacitor is a first capacitor, and the first SC circuit and the second SC circuit each further comprise:

a second capacitor having a third terminal and a fourth terminal;

a fourth switch coupled to the fourth terminal and receiving the first input signal or the second input signal;

a fifth switch coupled to the third terminal and receiving the first input signal or the second input signal;

a sixth switch coupled between the first terminal and the third terminal;

a fourth sub-SC circuit coupled to the second selection circuit and one of the first output node and the second output node and configured to generate a fourth candidate voltage according to a fourth preset voltage and the DC voltage; and a fifth sub-SC circuit coupled to the second selection circuit and one of the first output node and the second output node and configured to generate a fifth candidate voltage according to a fifth preset voltage and the DC voltage;

wherein the second selection circuit is electrically connected to the fourth terminal and outputs one of the first candidate voltage, the second candidate voltage, the third candidate voltage, the fourth candidate voltage, and the fifth candidate voltage to the fourth terminal according to the selection signal.

15. A capacitor switching amplifier circuit having a first input terminal, a second input terminal, a first output terminal, and a second output terminal, the capacitor switching amplifier circuit comprising:

a first sampling and amplifying circuit coupled to the first input terminal and configured to sample and amplify a first input signal;

a second sampling and amplifying circuit coupled to the second input terminal and configured to sample and amplify a second input signal;

an operational amplifier coupled to the first sampling and amplifying circuit and the second sampling and amplifying circuit and having a first output node and a second output node;

a first switched capacitor (SC) circuit coupled to the first output node and the first output terminal and configured to amplify the first input signal and the second input signal and to level shift a voltage at the first output node; and a second SC circuit coupled to the second output node and the second output terminal and configured to amplify the first input signal and the second input signal and to level shift a voltage at the second output node.

16. The capacitor switching amplifier circuit of claim 15 further comprising:

an analog-to-digital converter (ADC) coupled to the first input terminal and the second input terminal and configured to generate a selection signal according to the first input signal and the second input signal; and a selection circuit coupled to the ADC and configured to select a first reference voltage, a second reference voltage, a third reference voltage, and a fourth reference voltage from a plurality of preset voltages according to the selection signal;

wherein the first sampling and amplifying circuit amplifies the first input signal according to the first reference voltage, the second sampling and amplifying circuit amplifies the second input signal according to the second reference voltage, the first SC circuit level shifts a voltage at the first output node according to the fourth reference voltage, and the second SC circuit level shifts a voltage at the second output node according to the third reference voltage.

17. The capacitor switching amplifier circuit of claim 16, wherein the first SC circuit and the second SC circuit each comprise:

a first capacitor having a first terminal and a second terminal;

a second capacitor having a third terminal and a fourth terminal;

a first switch coupled to the first terminal and receiving the first input signal or the second input signal;

a second switch coupled to the second terminal and receiving the first input signal or the second input signal;

a third switch coupled to the fourth terminal and receiving one of the third reference voltage, the fourth reference voltage, and a direct current (DC) voltage;

a fourth switch coupled to the third terminal and receiving one of the third reference voltage, the fourth reference voltage, and the DC voltage;

a fifth switch coupled between the first terminal and the first output terminal or the second output terminal;

a sixth switch coupled to the fourth terminal; and a seventh switch coupled between the third terminal and the first output node or the second output node.

18. The capacitor switching amplifier circuit of claim 17, wherein the first SC circuit and the second SC circuit each further comprise:

a third capacitor having a fifth terminal and a sixth terminal;

an eighth switch coupled to the fifth terminal and receiving the first input signal or the second input signal;

a ninth switch coupled to the sixth terminal and receiving the first input signal or the second input signal; and a tenth switch coupled between the second terminal and the sixth terminal.

19. The capacitor switching amplifier circuit of claim 16, wherein the selection circuit is a first selection circuit, and the first SC circuit and the second SC circuit each comprise:

a capacitor having a first terminal and a second terminal;

a first switch coupled to the second terminal and receiving the first input signal or the second input signal;

a second switch coupled to the first terminal and receiving the first input signal or the second input signal;

a third switch coupled between the second terminal and the first output terminal or the second output terminal;

a second selection circuit coupled to the first terminal;

a first sub-SC circuit coupled to the second selection circuit and one of the first output node and the second output node and configured to generate a first candidate voltage according to a first preset voltage and a direct current (DC) voltage;

a second sub-SC circuit coupled to the second selection circuit and one of the first output node and the second output node and configured to generate a second candidate voltage according to a second preset voltage and the DC voltage; and a third sub-SC circuit coupled to the second selection circuit and one of the first output node and the second output node and configured to generate a third candidate voltage according to a third preset voltage and the DC voltage.

20. The capacitor switching amplifier circuit of claim 19, wherein the second selection circuit is electrically connected to the first terminal and outputs one of the first candidate voltage, the second candidate voltage, and the third candidate voltage to the first terminal according to the selection signal.

* * * * *